United States Patent
Bilodeau (10) Patent No.: US 12,300,498 B2
(45) Date of Patent: May 13, 2025

(54) FORMULATIONS TO SELECTIVELY ETCH SILICON-GERMANIUM RELATIVE TO SILICON

(71) Applicant: ENTEGRIS, INC., Billerica, MA (US)

(72) Inventor: Steven M. Bilodeau, Oxford, CT (US)

(73) Assignee: ENTEGRIS, INC., Billerica, MA (US)

( * ) Notice: Subject to any disclaimer, the term of this patent is extended or adjusted under 35 U.S.C. 154(b) by 0 days.

(21) Appl. No.: 18/525,636

(22) Filed: Nov. 30, 2023

(65) Prior Publication Data

US 2024/0096635 A1     Mar. 21, 2024

Related U.S. Application Data

(62) Division of application No. 15/951,030, filed on Apr. 11, 2018, now Pat. No. 11,875,997.

(60) Provisional application No. 62/484,180, filed on Apr. 11, 2017.

(51) Int. Cl.
| | |
|---|---|
| *H01L 21/306* | (2006.01) |
| *C09K 13/06* | (2006.01) |
| *H01L 21/02* | (2006.01) |
| *H01L 29/06* | (2006.01) |
| *H01L 29/66* | (2006.01) |
| *H01L 29/775* | (2006.01) |

(52) U.S. Cl.
CPC ........ *H01L 21/30604* (2013.01); *C09K 13/06* (2013.01); *H01L 21/02381* (2013.01); *H01L 21/0245* (2013.01); *H01L 21/02532* (2013.01); *H01L 29/0669* (2013.01); *H01L 29/0673* (2013.01); *H01L 29/66439* (2013.01); *H01L 29/775* (2013.01)

(58) Field of Classification Search
None
See application file for complete search history.

(56) References Cited

U.S. PATENT DOCUMENTS

| | | | |
|---|---|---|---|
| 5,685,946 | A | 11/1997 | Fathauer et al. |
| 5,906,708 | A | 5/1999 | Robinson et al. |
| 6,642,536 | B1 | 11/2003 | Xiang et al. |
| 6,787,423 | B1 | 9/2004 | Xiang et al. |
| 10,106,737 | B2 | 10/2018 | Dictus et al. |
| 10,672,891 | B2 | 6/2020 | Hashemi et al. |

(Continued)

FOREIGN PATENT DOCUMENTS

| | | |
|---|---|---|
| JP | 2003179159 A | 6/2003 |
| JP | 2004519090 A | 6/2004 |

(Continued)

OTHER PUBLICATIONS

Cams et al., Chemical etching of Si1-x Ge x in HF:H2O2:CH3COOH, Journal of The Electrochemical Society, vol. 142, No. 4, 1995, pp. 1260-1266, cited in the application.

(Continued)

*Primary Examiner* — Allan W. Olsen (57) ABSTRACT

Compositions useful for the selective removal by etching of silicon-germanium-containing materials relative to silicon-containing materials, from a microelectronic device having features containing these materials at a surface, the compositions containing hydrofluoric acid, acetic acid, hydrogen peroxide, and at least one additional acid that will improve performance as measured by one or more of an etching rate or selectivity and are tunable to achieve the required Si:Ge removal selectivity and etch rates.

5 Claims, 2 Drawing Sheets

(56) References Cited

U.S. PATENT DOCUMENTS

| | | |
|---|---|---|
| 2003/0227057 A1 | 12/2003 | Lochtefeld et al. |
| 2004/0154641 A1 | 8/2004 | Montierth |
| 2005/0084978 A1 | 4/2005 | Harnood et al. |
| 2005/0169096 A1 | 8/2005 | Lee et al. |
| 2007/0090094 A1 | 4/2007 | Thompson et al. |
| 2008/0194082 A1 | 8/2008 | Kato et al. |
| 2008/0261847 A1 | 10/2008 | Visintin et al. |
| 2009/0159871 A1 | 6/2009 | Lee et al. |
| 2010/0112728 A1 | 5/2010 | Korzenski et al. |
| 2012/0245228 A1 | 9/2012 | Harvey et al. |
| 2017/0136600 A1 | 5/2017 | Shinoda |
| 2017/0207100 A1 | 7/2017 | Park et al. |
| 2018/0197746 A1 | 7/2018 | Bilodeau et al. |
| 2018/0277379 A1 | 9/2018 | Dictus et al. |
| 2019/0284701 A1 | 9/2019 | Kim et al. |

FOREIGN PATENT DOCUMENTS

| | | |
|---|---|---|
| JP | 2008512862 A | 4/2008 |
| JP | 2009114508 A | 5/2009 |
| JP | 2010526431 A | 7/2010 |
| JP | 2010168255 A | 8/2010 |
| JP | WO2018181809 A1 | 5/2020 |
| KR | 20160091736 A | 8/2016 |
| TW | 201704538 A | 2/2017 |
| WO | 2006027332 A1 | 3/2006 |

OTHER PUBLICATIONS

Hollander B et al, Wet Chemical Etching of Si, Si1—xGex, and Ge in HF:H2O2: CH3COOH, Journal of The Electrochemical Society, Electrochemical Society Inc. USA, vol. 157, No. 6, 2010, pp. H643-H646, XP55485725, ISSN: 0013-4651, DOI: 10.1149/1.3382944.

FORMULATIONS TO SELECTIVELY ETCH SILICON-GERMANIUM RELATIVE TO SILICON

CROSS-REFERENCE TO RELATED APPLICATIONS

This application is a divisional of U.S. patent application Ser. No. 15/951,030, filed Apr. 11, 2018, which claims the benefit under 35 USC 119 of U.S. Provisional Patent Application No. 62/484,180, filed Apr. 11, 2017, the disclosures of which are hereby incorporated herein by reference in their entirety for all purposes.

FIELD OF THE INVENTION

The following description relates to compositions and processes for selectively etching silicon-germanium material at a surface of a microelectronic device substrate, relative to etching a silicon material at the same surface.

BACKGROUND

For decades, the ongoing trend of reducing the size of features of microelectronic devices, e.g., integrated circuits, has enabled increased densities of functional features on a range of microelectronic devices. For example, shrinking transistor size has allowed for an ever-increasing number of transistors to be included as part of an integrated circuit, a memory device, or another microelectronic device, leading to the fabrication of microelectronic devices that exhibit increased processing capabilities or memory capacity.

Steps of preparing certain microelectronic devices, e.g., integrated circuits, may include selectively removing silicon-germanium (SiGe) material from a surface that contains the SiGe in combination with silicon (Si). According to certain example fabrication steps, SiGe may be used as a sacrificial layer in a structure that also contains silicon. Based on such fabrication steps, advanced device structures may be prepared, such as silicon nanowires and silicon on nothing (SON) structures. Steps in these processes include epitaxial deposition of a structure of alternating layers of Si and SiGe, followed by patterning and, eventually, selective lateral etching to remove the SiGe layers and generate a three-dimensional silicon structure.

In certain specific methods of preparing a field effect transistors (FET) for an integrated circuit, silicon (Si) and silicon-germanium (SiGe) materials are deposited as layers onto a substrate, i.e., as an "epitaxial stack" of Si and SiGe. The layers are subsequently patterned using standard techniques, such as by use of a standard lithographically-generated mask. Next, a directional isotropic etch may be useful to laterally etch away the sacrificial SiGe material, leaving behind a silicon nanowire structure.

SUMMARY

The present invention relates to novel and inventive etching compositions and related processes for selectively removing, by etching, a silicon-germanium material relative to silicon-containing material, both of which are present at a surface of an in-process microelectronic device that may optionally include other conductive, insulative, or semiconductive materials (silicon oxide), or a material that is useful during another fabrication step such as a barrier layer material (e.g., silicon nitride).

In the past, the integrated circuit and semiconductor fabrication industries have used aqueous etching compositions that contain about one part hydrofluoric acid HF, two parts hydrogen peroxide solution, and six parts acetic acid ("AA"). Etching compositions made from these three ingredients have been described as providing good etching rates for SiGe with high selectivity to silicon.

These three-part (HF/AA/$H_2O_2$) compositions have been found not to be suitable for preparing silicon nanowires in a field effect transistor structure, or for preparing other such delicate and complicated three-dimensional structures. One shortcoming of the performance of these etching compositions is that the selectivity for etching SiGe relative to silicon diminishes as the amount of germanium in the sacrificial SiGe material is reduced. And at the same time, the sacrificial SiGe is preferred to contain a minimum amount of germanium, so that the sacrificial SiGe material provides the best possible match for the silicon features.

Another shortcoming is that these three-part etching compositions tend to require a long time to achieve a stable etch rate "after $H_2O_2$ addition" (hydrogen peroxide is often added to the three-part etching composition at a point-of-use, see infra).

Additionally, with certain in-process microelectronic devices, one or more other materials (e.g., $SiN_x$ or $SiO_2$) or other materials fabricating a microelectronic device, may also be present at a surface that contains the SiGe and silicon. Previously-used three-part (HF/AA/$H_2O_2$) etching composition tend to be relatively effective to etch these other materials, possibly due to the high amount of HF used in these systems. But preferred methods of etching the device would desire to minimize etching of these other materials. In preferred methods of selectively etching SiGe located on a surface that contains silicon along with silicon nitride or silicon oxide, the etching composition and its method of use can preferably exhibit a reduced, inhibited, or minimum rate of removal of the silicon nitride, silicon oxide, or both. An etching composition that contains a high concentration of hydrofluoric acid would not be expected to be suitable for etching a substrate that also has exposed silicon nitride or exposed silicon oxide.

In preferred etching compositions of the present invention, the one or more additional acids included in an etching composition that contains HF/AA/$H_2O_2$, can be effective to produce a composition that alleviates one or more of these shortcomings of the three-part etching compositions. When used in a method of etching a microelectronic device surface that contains silicon and silicon-germanium features at a surface, the inventive etching compositions can exhibit desired, useful, or advantageous performance relative to a comparable etching composition. One example of a comparable etching composition is an etching composition that contains (by weight percent) 11:22:67 HF(49%):AA(99%):$H_2O_2$(30%) and no other ingredients. A different example of a comparable etching composition is an etching composition that is an otherwise identical HF/AA/$H_2O_2$ etching composition but that does not include one or more additional acids as described herein, e.g., formic acid, sulfuric acid, lactic acid, or a combination of two or more of these. The improved performance can be measured as one or more of: selectivity of etching silicon-germanium relative to silicon; desirably increased silicon-germanium etch rate; a desirably reduced silicon etch rate; a low etch rate of silicon oxide, silicon nitride, or both. Also preferably, an inventive process that uses an inventive etching composition can exhibit an improved (reduced) amount of time to achieve an etch rate of SiGe that is 90 percent of a maximum etch rate of SiGe that is eventually achieved by the inventive process.

With more specificity, example etching compositions used in an inventive method of etching a substrate that contains silicon and silicon-germanium structures at a surface can exhibit selectivity in etching silicon-germanium relative to silicon that is improved as compared to a comparable etching method performed on an identical microelectronic device substrate and using the same conditions and the same equipment, with the only difference being that the etching solution of the comparable etching method does not contain any added acid ingredient and contains only a combination of HF, AA, and hydrogen peroxide in the same relative amounts as does the inventive etching composition. Alternately, the improvement can be measured against a comparable etching method that uses an etching composition that contains 11:22:67 HF(49%):AA(99%):$H_2O_2$(30%), with each of the components specified by weight % in water and the relative amounts specified by weight. Selectivity is a ratio of a removal rate of one material (e.g., silicon-germanium) to a removal rate of a second material (e.g., silicon). According to preferred inventive etching methods as described, using an inventive etching composition that contains HF, AA, hydrogen peroxide, and one more additional acids as described, the selectivity of the removal of silicon-germanium to silicon can be increased if the SiGe etch rate is increased relative to the Si etch rate.

Alternately or in addition, example etching compositions used in an inventive method of etching a microelectronic device substrate that contains silicon and silicon-germanium structures at a surface can exhibit an etch rate of silica-germanium that is improved (increased) relative to a comparable etching method performed on an identical microelectronic device substrate and using the same conditions and the same equipment, with the only difference being that the etching solution of the comparable etching method does not contain any added acid ingredient and contains only a combination of HF, AA, and hydrogen peroxide in the same relative amounts as does the inventive etching composition. Alternately, the improvement can be measured against a comparable etching method that uses an etching composition that contains (by weight percent) 11:22:67 HF(49%): AA(99%):$H_2O_2$(30%).

Etch rate is known performance measure of an etching process and can be reported in terms of an amount of material (e.g., in thickness) removed per time (e.g., nanometers of material per minute). Useful methods of determining etch rate of silicon-germanium can be performed by etching a substrate that includes silicon-germanium at a surface. An example substrate may include an epitaxial layer of silicon-germanium disposed on silicon. Any method of measuring an amount of etching may be effective, with spectroscopic ellipsometry being one useful and preferred method for measuring silicon-germanium etch rate.

According to preferred inventive etching methods as described, using an inventive etching composition that contains HF, AA, hydrogen peroxide, and one more additional acids as described, an etch rate of silicon-germanium can be increased by at least 10, 20, 50, 60, 80, or even 100 percent compared to the etch rate of a comparable etching method; for example if a comparable etching method exhibits a silicon-germanium etch rate of 20 nanometers per minute, the improved method can exhibit a silicon-germanium etch rate of at least 22, 24, 30, 32, 36, or 40 nanometers per minute, i.e., an increase of 10, 20, 50, 60, 80, or even 100 percent from the etch rate of 20 nanometers per minute achieved by the comparable method.

Alternately or in addition, example etching compositions used in an inventive method of etching a microelectronic device substrate that contains silicon and silicon-germanium structures at a surface can exhibit an etch rate of silicon that is improved (decreased) relative to a comparable etching method performed on an identical microelectronic device substrate and using the same conditions and the same equipment, with the only difference being that the etching solution of the comparable etching method does not contain any added acid ingredient and contains only a combination of HF, AA, and hydrogen peroxide in the same relative amounts as does the inventive etching composition. Alternately, the improvement can be measured against a comparable etching method that uses an etching composition that contains 11:22:67 HF(49%):AA(99%):$H_2O_2$(30%) (by weight percent).

Useful methods of determining etch rate of silicon can be performed by etching a substrate that includes silicon-on-insulator (SOI) at a surface. Any method of measuring an amount of etching may be effective, with spectroscopic ellipsometry being one useful and preferred method for measuring silicon etch rate.

According to preferred inventive etching methods as described, using an inventive etching composition that contains HF, AA, hydrogen peroxide, and one more additional acids as described, an etch rate of silicon can be decreased by at least 10, 20, or 30 percent, compared to the etch rate of a comparable etching method; for example if a comparable etching method exhibits a silicon etch rate of not greater than 2 nanometers per minute, the improved method can exhibit a silicon etch rate of not greater than 1.8, 1.6, or 1.4 nanometers per minute, i.e., a decrease of 10, 20, or 30 percent relative to the etch rate of not greater than 2 nanometers per minute achieved by the comparable method.

Alternately or in addition, example etching compositions used in a method of etching a microelectronic device substrate that contains silicon and silicon-germanium structures at a surface can achieve a 90 percent SiGe etch rate in a time that is substantially less than the amount of time that is required for a comparable etching method (as described herein) to achieve a 90 percent SiGe etch rate. A maximum etch rate can be identified by measuring etch rate, versus the elapsed time of the etching step (i.e., amount of material removed from a surface in distance/time, during the time following the beginning of the etching step, which coincides with a time at which hydrogen peroxide is added to acid ingredients to form the etching composition). A maximum etch rate, also referred to as a "stable etch rate" is a rate of removal by etching of a particular material of a substrate surface, achieved during an etching step (or process), at a time during the etching step at which that rate has become substantially constant, i.e., the etch rate is changing by less than 10% during the following 1 hour period; alternately, a maximum etch rate may be considered to be an etch rate of the process at a time of 4 hours after an etching procedure begins, at which time hydrogen peroxide is mixed with the other dissolved (acid) materials of the etching composition and applied to the surface. A 90 percent etch rate is a rate that is 90 percent of the maximum etch rate.

According to preferred inventive etching methods as described, using an inventive etching composition that contains HF, AA, hydrogen peroxide, and one more additional acids as described (e.g., formic acid, sulfuric acid, lactic acid, or a combination of these), the inventive method can reach a SiGe etch rate that is 90 percent of a maximum SiGe etch rate, in an amount of time that is 10, 20, 30 or 50 percent less than (i.e., more sooner than) the amount of time required for a comparable etching method to achieve its own 90 percent of maximum SiGe etch rate. For example if a comparable etching method achieves a 90 percent of maximum SiGe etch rate in 120 minutes, the improved and inventive method can achieve a 90 percent of maximum SiGe etch rate in 108 minutes or less, 96 minutes or less, 84 minutes or less, or 60 minutes or less, i.e., a decrease of 10, 20, 30 or 50 percent relative to 120 minutes required by the comparable method to achieve a 90 percent etch rate. These amounts of time (e.g., in minutes, hours, etc.) required to achieve a 90 percent of maximum etch rate are independent of the value of the maximum etch rate (having units of, e.g., nanometers per minute).

Alternately or in addition, example etching compositions used in an inventive method of etching a microelectronic device substrate that contains silicon and silicon-germanium structures at a surface, as well as one or more other material such as silicon nitride or silicon oxide, can exhibit an etching rate of the silicon nitride or silicon oxide (or both) that is improved (decreased) relative to a comparable etching method performed on an identical microelectronic device substrate and using the same conditions and the same equipment, with the only difference being that the etching solution of the comparable etching method does not contain any added acid ingredient and contains only a combination of HF, AA, and hydrogen peroxide in the same relative amounts as does the inventive etching composition. Alternately, the improvement can be measured against a comparable etching method that uses an etching composition that contains (by weight percent) 11:22:67 HF(49%):AA(99%):$H_2O_2$(30%).

According to preferred inventive etching methods as described, using an inventive etching composition that contains HF, AA, hydrogen peroxide, and one more additional acids as described, an etch rate of silicon nitride, silicon oxide, or both, can be decreased by at least 10, 20, or 30 percent, compared to the etch rate of a comparable etching method; for example if a comparable etching method exhibits a silicon nitride or silicon oxide etch rate of not greater than 2 nanometers per minute, the improved method can exhibit a silicon nitride or silicon oxide etch rate of not greater than 1.8, 1.6, or 1.4 nanometers per minute, i.e., a decrease of 10, 20, or 30 percent relative to the etch rate of not greater than 2 nanometers per minute achieved by the comparable method.

An amount of a chemical material such as acid or hydrogen peroxide that is dissolved in an aqueous etching composition, i.e., a solution, can be described on a basis of parts by weight of the dissolved material per parts by weight (e.g., per 100 parts by weight) of a total amount dissolved materials in the etching composition that contains the dissolved materials. This (parts by weight) basis for reporting amounts and relative amounts of dissolved materials in an aqueous etching composition is a convenient basis for reporting amounts and relative amounts of these dissolved materials because this basis relates only to the amount and relative amounts of the dissolved materials and is independent of the amount of water in the solution. This parts by weight basis, therefore, conveniently defines the amounts and relative amounts of dissolved chemical materials of the etching composition relative to each other and not based on a concentration relative to water. The relative amounts of the dissolved chemical materials will not change based on a higher or lower amount of water in the etching composition.

When an aqueous etching composition that contains dissolved ingredients is prepared by combining two or more aqueous ingredients (solutions) such as a combination of two or more aqueous acids solutions with a hydrogen peroxide solution, with each aqueous ingredient containing a known concentration of dissolved chemical material, the amount of dissolved ingredient present in the combined solution (on a relative parts by weight basis) will be the amount (by weight) of the dissolved ingredient in the aqueous ingredient that is used prepare the combined solution, per the total amount of all dissolved ingredients from all ingredients that are used to prepare the combined solution. The values can be normalized to be based on a total of 100 parts by weight dissolved materials.

On this basis, amounts and relative amounts of dissolved chemical materials of an etching composition can be calculated as the weight percent of the dissolved chemical material (e.g., acid or hydrogen peroxide) that is present in an acid or hydrogen peroxide solution that is an ingredient of the etching composition, multiplied by the amount (e.g., volume or mass) of that ingredient that is included in the etching composition, divided by the total amount of all such dissolved ingredients used to prepare the etching composition.

As an example, etching compositions may be prepared from ingredients such as the following three: 1) 11 parts by weight of 49 percent by weight hydrofluoric acid (HF) solution; 67 parts by volume of 99 percent by weight of acetic acid, and 22 parts by volume of 30 percent by weight of hydrogen peroxide. The 11 parts by weight of the 49 percent HF ingredient contribute 5.39 parts by weight of dissolved hydrofluoric acid to the etching composition. The 67 parts by weight of the 99 percent acetic acid ingredient contribute about 66.33 parts by weight of dissolved acetic acid to the etching composition. And the 22 parts by weight of the 30 percent hydrogen peroxide ingredient contribute about 6.6 parts by weight of dissolved hydrogen peroxide to the etching composition. The total amount of dissolved ingredients is 78.3 parts by weight (5.4 parts by weight dissolved HF, 66.3 parts by weight dissolved acetic acid, and 6.6 parts by weight dissolved hydrogen peroxide). The balance, 22.68 parts by weight, is water.

The amount of dissolved chemical material, reported on a parts by weight dissolved chemical material per 100 parts by weight of total dissolved materials in the etching composition, is as follows: about 6.89 parts by weight dissolved HF (5.4 parts dissolved HF per 78.3 parts by weight total dissolved ingredients); about 84.7 parts by weight dissolved acetic acid (66.3 parts dissolved HF per 78.3 parts by weight total dissolved ingredients); and about 8.43 parts by weight dissolved hydrogen peroxide (6.6 parts dissolved hydrogen peroxide per 78.3 parts by weight total dissolved ingredients).

In one aspect, the invention relates to a method of selectively removing silicon-germanium from a surface of a microelectronic device relative to a silicon-containing material. The method includes: providing a microelectronic device surface that includes silicon and silicon-germanium; providing an aqueous etching composition comprising: hydrogen fluoride, dissolved hydrogen peroxide, dissolved acetic acid, dissolved formic acid, and dissolved sulfuric acid; and contacting the surface with the silicon-germanium-selective etching composition for time and at a temperature effective to selectively remove silicon-germanium relative to the silicon.

In another aspect the invention relates to an etching composition for selectively removing silicon-germanium from a surface of a microelectronic device relative to silicon.

The composition comprises: hydrogen fluoride, dissolved acetic acid, dissolved formic acid, and dissolved sulfuric acid, in water.

DETAILED DESCRIPTION

The present invention relates to novel and inventive etching compositions and related novel and inventive processes for selectively removing, by etching, silicon-germanium from an in-process microelectronic device surface that contains structures made of silicon-germanium, and of silicon. The surface may optionally also include other conductive, insulating (e.g., silicon oxide), or semiconducting materials, or one or more materials known to be useful during processing of a microelectronic device, such as a barrier layer material (e.g., silicon nitride).

The term "microelectronic device" (or "microelectronic device substrate," or simply "substrate") is used herein in a manner that is consistent with the generally understood meaning of this term in the electronics, microelectronics, and semiconductor fabrication arts, for example to refer to any of a variety of different types of: semiconductor substrates; integrated circuits; solid state memory devices; hard memory disks; read, write, and read-write heads and mechanical or electronic components thereof; flat panel displays; phase change memory devices; solar panels and other products that include one or more solar cell devices; photovoltaics; and microelectromechanical systems (MEMS) manufactured for use in microelectronic, integrated circuit, energy collection, or computer chip applications. It is to be understood that the term microelectronic device can refer to any in-process microelectronic device or microelectronic device substrate that contains or is being prepared to contain functional electronic (electrical-current-carrying) structures, functional semiconductor structures, and insulating structures, for eventual electronic used in a microelectronic device or microelectronic assembly.

As used herein, the term "silicon" refers to various types of crystalline silicon, including Si, polycrystalline Si, and (preferably) monocrystalline Si. The silicon may be present in any structure (i.e., substrate) that is known or that is useable as a substrate or structure for making a microelectronic device by steps of semiconductor fabrication, including in the form of silicon-on-insulator (SOI) wafers that may be used, for example, as a substrate or part of a substrate for of an electronic device such as a field-effect-transistor (FET) or an integrated circuit or other microelectronic device that contains a field-effect-transistor. The silicon is made substantially of one or more crystals of silicon atoms that may be may be p-doped, n-doped, or neither, and may contain dopant or other impurities in an amount that is sufficiently low to be acceptable for preparing a microelectronic device.

The term "silicon-germanium" (or "SiGe") is used herein in a manner that is consistent with the meaning of this term in the semiconductor and materials arts. These silicon-germanium materials may contain essentially only silicon and germanium atoms, in a crystal lattice structure, and do not require any other atomic constituents. The relative amounts of silicon atoms to germanium atoms may be as desired. But for microelectronic devices and methods of processing microelectronic devices as described herein, the amount (concentration, on an atomic basis) of germanium atoms will be substantially lower than the amount (concentration) of silicon atoms in the silicon-germanium material. In processes that involve the use of silicon-germanium as a sacrificial material to produce silicon structures (e.g., silicon nanowires), the sacrificial silicon-germanium material can preferably be as similar as possible, compositionally, to the silicon in composition and with respect to physical properties. In specific, it is desired to use as little germanium as possible in a silicon-germanium sacrificial material. In processes that use silicon-germanium as a sacrificial material in combination with silicon as a non-sacrificial material, it can be desirable for the silicon-germanium material to have a composition and properties that are as closely matched as possible to the silicon. A closely-matched sacrificial material can result in the highest quality structural and performance features of the silicon structures, after the silicon-germanium is selectively removed by etching. Normally, and preferably, sacrificial silicon-germanium for use in a method as described can include less than 50 percent (atomic) germanium, e.g., less than 30, 25, 20, 15, or 10 atoms germanium per 100 total atoms of germanium and silicon. Preferred silicon-germanium for use as sacrificial silicon-germanium in a method as described herein may be described as having the formula:

$$Si_x:Ge_y$$

wherein x is in a range from about 0.70 to 0.90; y is in a range from about 0.10 to about 0.30; and x+y=1.00. The SiGe may optionally be n-doped or p-doped, but for use of SiGe material as sacrificial material, doping is not necessary. The SiGe may contain dopant or other impurities in an amount that is not too high to be acceptable for preparing a microelectronic device.

Example inventive etching compositions as described can be in the form of an aqueous solution that contains dissolved materials (dissolved in water of the etching composition), the dissolved materials comprising, consisting of, or consisting essentially of: hydrogen fluoride (HF), dissolved acetic acid (i.e., $CH_3CO_2H$, hydrogen acetate, or methanecarboxylic acid, sometimes referred to herein as "AA"), and dissolved hydrogen peroxide ($H_2O_2$), as well as one or more additional dissolved acids that improve performance of the etching composition, e.g., formic acid, lactic acid, sulfuric acid, or a combination of these. These acid and hydrogen peroxide materials are dissolved in an amount of water of the etching composition.

As a general convention throughout the present description, a composition or ingredient (e.g., acid solution) that is said to "consist essentially of" water and a dissolved material or a group of listed dissolved materials refers to a composition or ingredient that contains the water and the dissolved material or group of listed dissolved materials, with not more than an insignificant amount of other dissolved or un-dissolved (non-aqueous) materials, e.g., not more than 5, 2, 1, 0.5, 0.1, or 0.05 parts by weight of another dissolved or un-dissolved material other than the identified dissolved materials. For example, an etching composition that contains dissolved (non-aqueous) materials that consist essentially of: hydrogen fluoride (HF), dissolved acetic acid, dissolved hydrogen peroxide ($H_2O_2$), and one or more additional dissolved acids that improve performance of the etching composition, e.g., formic acid, lactic acid, sulfuric acid, or a combination of these, means a composition that contains these ingredients and not more than 5, 2, 1, 0.5, 0.1, or 0.05 parts by weight of any other dissolved or undissolved material or materials (individually or as a total) other than the identified dissolved materials (hydrogen fluoride (HF), dissolved acetic acid, dissolved hydrogen peroxide ($H_2O_2$), and one or more additional dissolved acids that improve performance of the etching composition, e.g., formic acid, lactic acid, sulfuric acid, or a combination of these).

In use, the dissolved acid and hydrogen peroxide materials may be provided in a single "point-of-use composition," which is a composition that is provided and optionally prepared at a location and time at which the etching composition will be used by a user, e.g., in a semiconductor fabrication process, to etch an in-process microelectronic device to selectively remove silicon-germanium from a surface of the device that contains silicon-germanium, silicon, and optionally other exposed feature made of other materials such as silicon nitride or silicon oxide.

Optionally, and preferably, an etching composition that is a point-of-use composition can be prepared by combining aqueous acid materials with the hydrogen peroxide, at or near the time of use, i.e., "at a point-of-use." Desirably, hydrogen peroxide may be held and stored separately from acid ingredients, and may be added to the acid ingredients at a time before the etching composition is to be used in a process or etching a microelectronic device, such as not more than 3 hours, 2 hours, 1 hour, or 0.5 hours before using the etching composition. This invention allows for reduced time for stable etching high selective removal of $Si_xGe_y$ relative to Si.

The acid ingredients of an etching composition may be combined at a point-of-use by combining each of the different separate acid ingredients at the point-of-use, although combining the acid ingredients at a point-of-use is not normally preferred. Instead, preferably, a single composition, i.e., solution, of all of the acid materials (i.e., an "aqueous acids composition") can be previously prepared. This aqueous acids composition can be a single composition that contains all dissolved acid materials of an etching composition, in water. The aqueous acids composition can be prepared by combining: an aqueous hydrofluoric acid solution; an aqueous or concentrated acetic acid solution or non-aqueous acetic acid composition; and one or more of aqueous formic acid solution, aqueous sulfuric acid solution, and an amount of lactic acid or lactic acid solution. A preferred aqueous acids composition can contain water and dissolved acid materials that consist of or consist essentially of hydrofluoric acid; dissolved acetic acid; dissolved hydrogen peroxide; and one or more of dissolved formic acid, dissolved sulfuric acid, dissolved lactic acid, or two or more of these additional dissolved acid materials.

Advantageously, combining aqueous acid ingredients (e.g., in the form of an aqueous acids composition), with the hydrogen peroxide at or just before the composition is to be used in an etching process, allows the etching composition to be used at a time when reactions between hydrogen peroxide and dissolved acid materials, e.g., dissolved formic acid and dissolved acetic acid, have just begun to occur.

Hydrogen peroxide can be reactive with one or more of the dissolved acids present in an etching composition as described herein, e.g., acetic acid and formic acid. Hydrogen peroxide can react with acetic acid to produce per-acetic acid ($H_3CC(O)OOH$) (peroxyacetic acid, acetic peroxide, acetyl hydroperoxide, proxitane):

Hydrogen peroxide can also react with formic acid to produce per-formic acid ($HC(O)OOH$) (hydroperoxyformaldehyde, formyl hydroperoxide, permethanoic acid, peroxyformic acid):

Without being bound by theory, it is believed that the presence of per-acetic acid and per-formic acid in an etching composition of the present description, at a point-of-use and during a step of etching a microelectronic device substrate as described, may be responsible for at least some of the desired performance benefits of an etching composition of the present description. In specific, the presence of per-acetic acid or per-formic acid in an etching composition, during an etching step, especially during an early portion of the etching step, is believed to reduce the amount of time required for the process to achieve a silicon-germanium etch rate that is 90 percent of a maximum silicon-germanium etch rate achieved during the etching step.

Improved performance of an inventive composition and method can be measured relative to the performance of an otherwise identical etching composition, i.e., a "comparable etching composition," that is identical to an inventive etching composition except that the comparable etching composition does not contain any additional acid material as described herein. Alternately, improved performance can be measured against a comparable etching method that uses a comparable etching composition that contains (by weight percent) 11:22:67 HF(49%):AA(99%):$H_2O_2$(30%) without any other ingredients. The inventive etching compositions and methods exhibit improved performance relative to a comparable method that is performed on an identical substrate, using identical equipment and conditions, and using a comparable etching composition as described.

An etching composition as described includes hydrogen fluoride, i.e., dissolved hydrogen fluoride. The hydrogen fluoride can be provided in the etching composition in the form of aqueous hydrofluoric acid as an ingredient used to prepare the etching composition. Hydrofluoric acid is a known acid material made of hydrogen fluoride (HF) dissolved in water. Hydrofluoric acid is available in a range of concentrations of hydrogen fluoride dissolved in water. A hydrofluoric acid solution of any useful HF concentration may be used as an ingredient to prepare an etching composition as described, by combining the HF solution with other ingredients such as acetic acid, hydrogen peroxide solution, etc., in any amount that will provide a desired amount of dissolved hydrogen fluoride in the etchant composition, e.g., an amount effective in combination with the other ingredients to produce a useful etching composition as described.

A useful or preferred etching composition as described can contain any useful or desired amount of dissolved hydrogen fluoride. Preferred etching composition can include a relatively reduced amount of hydrogen fluoride as compared to previous etching compositions that contain a combination of HF, AA, and $H_2O_2$, when described on a basis of total dissolved materials of the etching composition. For example, a useful etching composition may contain less than 10 parts by weight dissolved hydrogen fluoride based on 100 parts by weight of dissolved materials in the etching composition, such as less than 8, 5, or 3 parts by weight HF based on 100 parts by weight dissolved materials in the composition. Optionally, a preferred etching composition may contain less than 2 or less than 1 part by weight HF based on 100 parts by weight dissolved materials in the composition. These amounts describe the amount of dissolved hydrogen fluoride present in the etching composition at a time at which or soon after which hydrogen peroxide is combined with the acid ingredients to form a "point-of-use composition."

Desirably, the reduced amount of hydrogen fluoride in an etching composition may be effective to control an etch rate of silicon germanium, meaning to avoid an etch rate of silicon-germanium that is too rapid. An etch rate that is too fast can reduce quality of a processed microelectronic device. A reduced amount of hydrogen fluoride can also avoid an etch rate of $SiN_x$ or $SiO_2$ that is too high. HF has a strong ability to etch $SiN_x$ and $SiO_2$. According to preferred etching compositions and methods of the present description, the etch rate of $SiN_x$ or $SiO_2$ can be relatively low, to allow the inventive compositions and methods to be useful to process microelectronic devices that include structures at their surfaces that are made of $SiN_x$ or $SiO_2$, without causing excess removal of the $SiN_x$ or $SiO_2$.

The etching composition also contains hydrogen peroxide (i.e., $H_2O_2$, dioxidane, oxidanyl, or perhydroxic acid), i.e., dissolved hydrogen peroxide. The dissolved hydrogen peroxide can be provided in the etching composition in the form of aqueous hydrogen peroxide solution, as an ingredient used to prepare the etching composition. Hydrogen peroxide is a known chemical material and is often contained in an aqueous solution of the hydrogen peroxide dissolved in water. Aqueous hydrogen peroxide solutions are available in a range of concentrations of the hydrogen peroxide dissolved in water, including concentrations in a range from 1, 5, 10 percent hydrogen peroxide, up to 20, 30 or 40 percent, or higher, hydrogen peroxide dissolved in water (on a weight (grams) per volume (liter)) basis). A hydrogen peroxide solution of any useful concentration may be used as an ingredient to prepare an etching composition as described, by combining the hydrogen peroxide solution with other ingredients such as hydrofluoric acid (aqueous solution), acetic acid solution, etc., as described. The hydrogen peroxide can preferably be added to other ingredients of the etching composition at a point-of-use. The hydrogen peroxide solution can contain any concentration of dissolved hydrogen peroxide that will be effective to combine the hydrogen peroxide solution with the other ingredients of an etching composition to produce a useful etching composition as described, containing a desired amount of dissolved hydrogen peroxide.

A useful or preferred etching composition as described can contain any useful or desired amount of dissolved hydrogen peroxide. Preferred etching compositions can contain a relatively increased amount of dissolved hydrogen peroxide as compared to previous etching compositions that contain a combination of HF, AA, and $H_2O_2$, when described on a basis of total (or 100 parts by weight) dissolved materials of the etching composition. For example, a useful etching composition may contain at least 10, 12, 15, 20, 25 or at least 30 or 35 parts by weight dissolved hydrogen peroxide based on 100 parts by weight dissolved materials in the composition.

These amounts describe the amount of dissolved hydrogen peroxide present in an etching composition at a time at which or soon after which the hydrogen peroxide is combined with dissolved acid materials to form a "point-of-use composition." Hydrogen peroxide is known to be reactive with certain dissolved acid materials that may be present in the etching composition such as dissolved acetic acid and dissolved formic acid. The amount of hydrogen peroxide that is added to an etching composition that contains these dissolved acid materials may decrease as the hydrogen peroxide contacts and reacts with those dissolved acid materials.

The etching composition also contains acetic acid (i.e., $CH_3CO_2H$, hydrogen acetate, or methanecarboxylic acid, sometimes referred to herein as "AA"), i.e., dissolved acetic acid. The dissolved acetic acid can be provided in the etching composition in the form of aqueous acetic acid solution, or substantially non-aqueous (e.g., 99 percent) acetic acid, as an ingredient used to prepare the etching composition. Acetic acid is a known acid material made of acetic acid ($CH_3CO_2H$, hydrogen acetate, or methanecarboxylic acid), dissolved in water, including a low amount of water such as 99 percent acetic acid. Acetic acid, e.g., in solution, is available in a range of concentrations of acetic acid dissolved in water, including very high concentrations of at least 95, 98, or up to or in excess of 99 weight percent (weight (grams) per volume (liter)) acetic acid in water (and is sometime referred to as "glacial acetic acid" in the substantial absence of water). An acetic acid solution of any useful concentration, including a substantially non-aqueous (99 percent acetic acid) ingredient, may be used as an ingredient to prepare an etching composition as described, by combining the acetic acid with other ingredients such as hydrofluoric acid (aqueous solution), hydrogen peroxide solution, etc., as described. The acetic acid ingredient can contain any concentration of acetic acid that will be effective to combine the acetic acid ingredient with the other ingredients to produce a useful etching composition as described, containing a desired amount of dissolved acetic acid.

A useful or preferred etching composition as described can contain any useful or desired amount of dissolved acetic acid. Preferred etching composition can include a relatively reduced amount of dissolved acetic acid as compared to previous etching compositions that contain a combination of HF, AA, and $H_2O_2$, when described on a basis of dissolved materials of the etching composition. For example, a useful etching composition may contain less than 50 parts by weight dissolved acetic acid based on 100 parts by weight dissolved materials in the composition, such as an amount in a range from about 5 to 45, from 10 to 40, or from 15 to 35 parts by weight dissolved acetic based on 100 parts by weight dissolved materials in the etching composition.

These amounts of dissolved acetic acid in an etching composition are described as being present at a time at which, or soon after which, hydrogen peroxide is combined with dissolved acid materials to form a "point-of-use" composition. In use, when hydrogen peroxide is added to an aqueous solution that contains dissolved acetic acid, the acetic acid and the hydrogen peroxide can react to produce per-acetic acid. Advantageously, the per-acetic acid is believed to be effective in selectively etching silicon-germanium from a microelectronic device substrate surface that also contains silicon, and, when present in an effective amount at a time of initiating an etching step, the per-acetic acid is believed to be effective in reducing the amount of time for the etching step to achieve a silicon-germanium etch rate that is 90 percent of the maximum etch rate of the etching step.

The etching composition, in addition to the hydrogen fluoride, dissolved acetic acid, and dissolved hydrogen peroxide, may also contain an amount of dissolved formic acid (i.e., $CO_2H$, aminic acid, formylic acid, hydrogen carboxylic acid, hydroxymethanone, and sometimes referred to herein as "FA"). The dissolved formic acid can be provided in the etching composition in the form of an aqueous formic acid solution as an ingredient used to prepare the etching composition. Formic acid, in the form of an aqueous solution, is available in a range of concentrations, e.g., from 10 weight percent by volume, up to or exceeding 90 weight percent by volume. An aqueous formic acid solution of any useful concentration may be used as an ingredient to prepare an etching composition as described, by combining the aqueous formic acid solution as an ingredient, with other ingredients of an etching composition, such as with hydrofluoric acid (aqueous solution), acetic acid, hydrogen peroxide solution, etc., as described.

The amount of dissolved formic acid in an etching composition can be any useful amount, with preferred etching composition containing an amount of formic acid that is effective to improve one or more performance properties of the etching composition. Example etching compositions can contain up to about 40 parts by weight dissolved formic acid based on 100 parts by weight dissolved materials in the composition, such as an amount in a range from about 2 to 35, 5 to 30, or 10 to 25 parts by weight dissolved formic acid based on 100 parts by weight dissolved materials in the etching composition.

These amounts of dissolved formic acid of an etching composition are described as being present at a time at which, or soon after which, hydrogen peroxide is combined with the acid ingredients to form a "point-of-use" composition. In use, when hydrogen peroxide is added to an aqueous solution that contains dissolved formic acid, the formic acid and the hydrogen peroxide can react to produce per-formic acid. Advantageously, the per-formic acid (in combination with per-acetic acid also present in the etching composition) is believed to be effective in selectively etching silicon-germanium from a microelectronic device substrate surface that also contains silicon, and, when present in an effective amount at a time of initiating an etching step, the per-formic acid is believed to be effective in reducing the amount of time for the etching step to achieve a silicon-germanium etch rate that is 90 percent of the maximum etch rate of the etching step.

The etching composition, in addition to the hydrogen fluoride, dissolved acetic acid, and dissolved hydrogen peroxide, may also contain an amount of dissolved sulfuric acid (i.e., $H_2SO_4$, hydrogen sulfate). The dissolved sulfuric acid can be provided in the etching composition in the form of an aqueous sulfuric acid solution as an ingredient used to prepare the etching composition. Sulfuric acid, in the form of an aqueous solution, is available in a range of concentrations, e.g., from 10 weight percent by volume, up to or exceeding 90 weight percent by volume (e.g., 98 percent "concentrated sulfuric acid"). An aqueous sulfuric acid solution of any useful concentration may be used as an ingredient to prepare an etching composition as described, by combining the aqueous sulfuric acid solution as an ingredient, with other ingredients of an etching composition, such as with hydrofluoric acid (aqueous solution), acetic acid, hydrogen peroxide solution, etc., as described.

The amount of dissolved sulfuric acid in an etching composition can be any useful amount, with preferred etching composition containing an amount of dissolved sulfuric acid that is effective to improve one or more performance properties of the etching composition. Without being bound by theory, sulfuric acid is believed to catalyze the reaction of formic acid any hydrogen peroxide to produce per-formic acid, and to also catalyze the reaction of acetic acid with hydrogen peroxide to produce per-acetic acid. In the presence of sulfuric acid, the rate at which hydrogen peroxide reacts with acetic acid and formic acid to produce per-acetic acid and per-formic acid is increased. As a result, when hydrogen peroxide is added to an aqueous composition that contains dissolved formic acid, dissolved acetic acid, and dissolved sulfuric acid, the concentration of per-formic acid and per-acetic acid will increase more rapidly, as compared to the same combination of hydrogen peroxide with formic acid and acetic acid in the absence of the sulfuric acid. With respect to an etching composition as described, a higher concentration of per-acetic acid and per-formic acid in the composition at a time following addition of the hydrogen peroxide can be advantageous, in that the increased amounts of per-acetic acid and per-formic acid can increase an etch rate of silicon-germanium, reducing the amount of time required for an etching step to reach a silicon-germanium etch rate that is 90 percent of a maximum etch rate achieved by the etching step.

Preferred etching compositions can include an amount of dissolved sulfuric acid that will increase performance of the etching composition by reducing the amount of time required for an etching step to reach a silicon-germanium etch rate that is 90 percent of a maximum etch rate achieved by the etching step. Example amounts may be up to about 10 parts by weight dissolved sulfuric acid based on 100 parts by weight dissolved materials in the composition, such as an amount in a range from about 0.1 to 7, 0.5 to 5, or from 1 to 4 parts by weight dissolved sulfuric acid based on 100 parts by weight dissolved materials in the etching composition.

Optionally, example etching compositions also contain an amount of dissolved lactic acid ($CH_3CH(OH)CO_2H$, 2-hydroxypropanoic acid). Lactic acid is a water-soluble solid material and can be provided in the etching composition in the form of a solid lactic acid ingredient (e.g., water-soluble powder), or as aqueous lactic acid solution of the lactic acid dissolved in water. The amount of dissolved lactic acid in an etching composition can be any useful amount, with preferred etching composition containing an amount of dissolved lactic acid that is effective to improve one or more performance properties of the etching composition. For example, Applicant has identified that lactic acid in etching compositions and etching methods as described herein, can be effective to improve etching selectivity of silicon-germanium relative to silicon, when etching a substrate having both silicon-germanium relative and silicon on a surface.

Useful and preferred etching compositions can include an amount of dissolved lactic acid that will increase performance of the etching composition, such as by improving etching selectivity of silicon-germanium relative to silicon. Example amounts may be up to about 20 parts by weight dissolved lactic acid based on 100 parts by weight dissolved materials in the composition, such as an amount in a range from about 0.5 to 17, 1 to 15, or from 3 or 5 to 14 parts by weight dissolved lactic acid based on 100 parts by weight dissolved materials in the etching composition.

An aqueous etching composition as described, that contains dissolved acid and hydrogen peroxide as described, can contain an amount of water that allows the etching composition to be prepared and used as described herein. Example amounts of water can be in a range from 10 to 70 percent, e.g., from 15 to 60 percent, such as from 20 to 55 weight percent water based on total weight of etching composition.

An etching composition as described, in the form of an aqueous solution that contains dissolved acid materials and hydrogen peroxide, can be prepared by any method that will be useful to produce an etching composition as described, containing dissolved acid and hydrogen peroxide materials in amounts and types described herein. By one method, aqueous or solid ingredients of the different dissolved materials can be combined any simply mixed to uniformity. For example, aqueous solutions that contain a dissolved material can be combined and mixed to uniformity.

According to preferred methods, an etching composition can be prepared at a "point-of-use" composition by combining an aqueous solution of acid materials, with an aqueous solution of the hydrogen peroxide. Desirably, hydrogen peroxide may be held and stored separately from ingredients that contain an acid material. Also desirably, a single composition (e.g., aqueous solution, referred to as an "aqueous acids composition") that contains all acid materials of an etching composition may be previously prepared and then combined with the hydrogen peroxide at a point of use. The aqueous acids composition can contain, consist of, or consist essentially of acid materials as described herein, dissolved in a single aqueous solution. An example aqueous acids composition can contain, consist of, or consist essentially of hydrofluoric acid, dissolved acetic acid, formic acid, sulfuric acid, and optional lactic acid, all dissolved in water. Such an aqueous acids composition that consists essentially of hydrofluoric acid, dissolved acetic acid, formic acid, sulfuric acid, and optional lactic acid, all dissolved in water, can contain not more than 5, 2, 1, 0.5, 0.1, or 0.05 parts by weight of dissolved or un-dissolved materials other than the identified dissolved acid materials.

Figure 3:
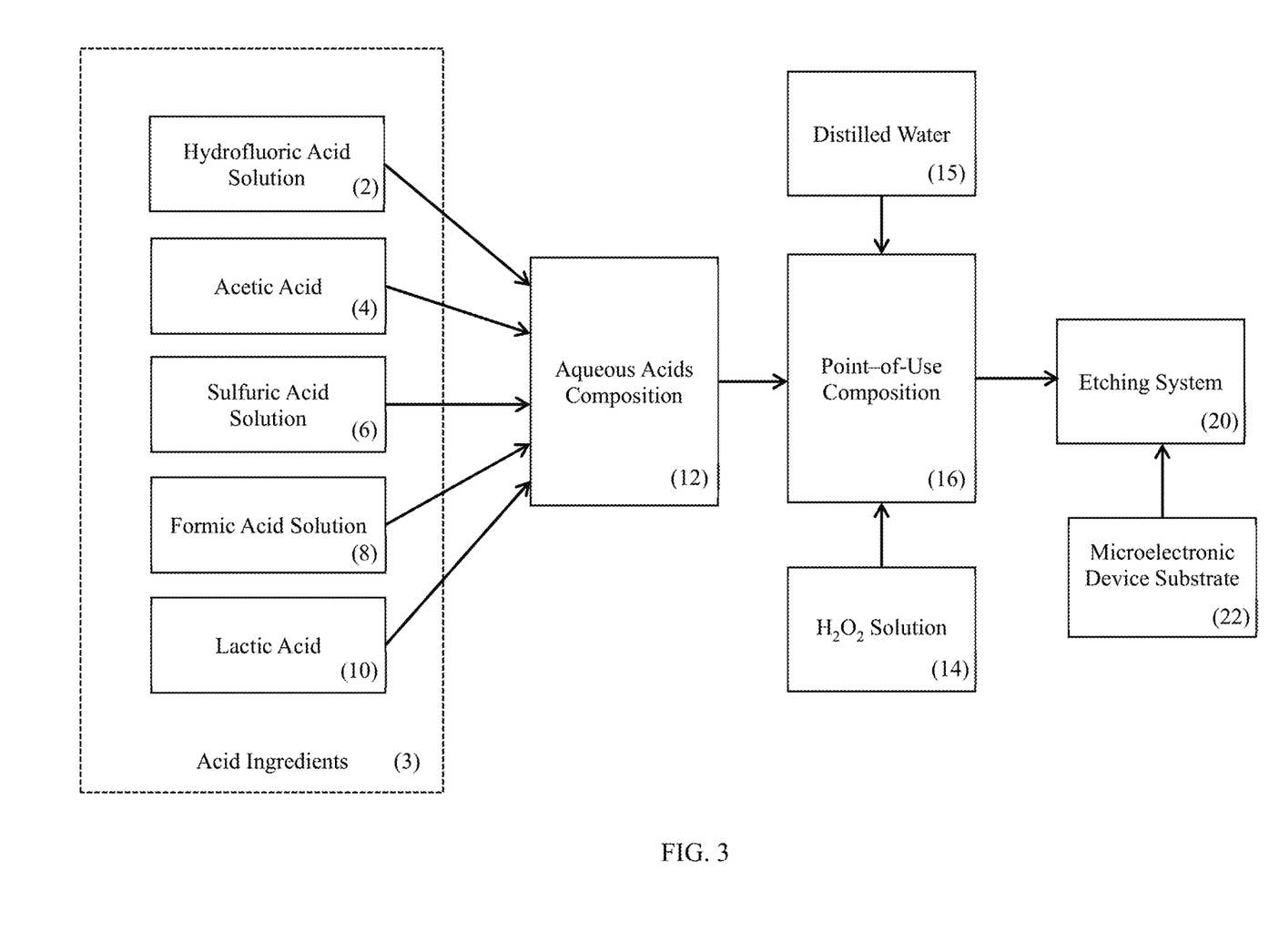
FIG. 3 shows a flow diagram of a method of preparing and using an etching composition.

Referring to FIG. 3, illustrated is a flow diagram of a preferred example of a method of preparing a point-of-use composition (i.e., aqueous etching composition, 16) from example ingredients that comprise, consist of, consist essentially of acid ingredients 3 and hydrogen peroxide ingredient (hydrogen peroxide solution) 14 (as well as additional optional water 15). The acid ingredients can comprise, consist of, or consist essentially of: hydrofluoric acid solution 2, acetic acid solution (e.g., highly concentrated, 99% acetic acid) 4, sulfuric acid solution 6, formic acid solution 8, and optional lactic acid (solid or solution) 10. (Ingredients that consist essentially of listed ingredients such as these are a set of ingredients that contains the listed ingredients and does not contain any more than 5, 2, 1, or 0.5 total weight percent of any other ingredient or ingredients.)

The acid ingredients 3 can be combined initially into an aqueous acids composition 12. This may be a composition that is prepared commercially, sold and transported to a customer, then used (after an optional storage period) by a customer in a step of etching a microelectronic device substrate. A customer, at a point-of-use, can combine the aqueous solids composition (solution) 12 with an amount of hydrogen peroxide solution 14, and optional distilled water 15, to produce point-of-use composition 16 containing dissolved acid and dissolved hydrogen peroxide ingredients as described herein. Within a short period of time after combing the acid ingredients 3 (e.g., aqueous acids composition 12) with the hydrogen peroxide solution 14, the point-of-use composition 16 can be used in an etching step at etching system 20. Etching system 20 may be used to perform any desired type of etching step on microelectronic device substrate 22. As a single example, the substrate 22 and etching step may be as shown at step 3 of FIG. 1 of the Examples, herein.

An etching composition as described may be prepared and packaged for storage and sale as single-package formulations or as multi-part formulations that are mixed at or before the point-of-use. One or more parts of a multi-part formulation may contain any combination of ingredients or dissolved materials that when mixed together form an etching composition as desired. Preferred etching compositions can be prepared for and packaged as a multi-part formulation or multi-part product that includes one part (i.e., one separate composition) that is the aqueous acids composition that contains dissolved acid materials and does not contain hydrogen peroxide. The aqueous acids composition can be part of a multi-part formulation that includes the aqueous acids composition and a separate hydrogen peroxide solution, which contains hydrogen peroxide in an amount and concentration that allows direct mixing of the hydrogen peroxide solution with the aqueous acids composition to produce an etching composition that contains desired amounts of all dissolved acid and hydrogen peroxide materials. The hydrogen peroxide composition may be sold in combination with the aqueous acids composition, or may alternately be provided separately to or by a customer, i.e., user of the etching composition. Optionally, the concentrations of materials of single- or multi-part composition may be concentrated, meaning that the composition contains an amount of water that is reduced relative to the amount of water that is to be included in an etching composition at a point-of-use. Accordingly, a user of a concentrated composition can combine the concentrated composition with an amount of water (preferably deionized water), e.g., 1, 2, 4, 5, 7, or 10 volumes water per volume of concentrated composition, to form the etching composition having a desired amount of water, and desired concentrations of dissolved materials, for use.

The etching compositions are useful for methods of selectively removing silicon-germanium material from a surface of a microelectronic device substrate, relative to silicon. containing material using the silicon selective composition is contemplated. Methods of etching microelectronic device substrates are known in the semiconductor fabrication arts, and can be performed on known and commercially available equipment. Generally, to etch a substrate to selectively remove a material at a surface of the substrate, etching composition can be applied to the surface and allowed to contact surface structures to selectively remove certain of the structures, chemically. The etching composition can be applied to the surface in any suitable manner, such as by spraying the etching composition onto the surface; by dipping (in a static or dynamic volume of the composition) the substrate into etching composition; by contacting the surface with another material, e.g., a pad, or fibrous sorbent applicator element, that has etching composition absorbed thereon; by contacting the substrate with an amount of the etching composition in a circulating pool; or by any other suitable means, manner or technique, by which the etching composition is brought into removal contact with the surface of the microelectronic substrate that contains silicon-germanium and silicon. The application may be in a batch or single wafer apparatus, for dynamic or static cleaning.

The conditions (e.g., time and temperature) of a useful etching process can be any that are found to be effective or advantageous. Generally, etching composition is contacted with the surface for a time that is sufficient to selectively remove silicon-germanium, with the etching composition being at a temperature that is effective for selective removal of the silicon-germanium. The amount of time for an etching step should not be too short, because this means that an etch rate of silicon-germanium may be too high, which can lead to reduced quality of a microelectronic device at the end of an etch step. Of course the amount of time required for an etch step is preferably not unduly long, to allow good efficiency and throughput of an etching process and semiconductor fabrication line. Examples of useful times for an etching step may be in a range from about 5 minutes to about 200 minutes, preferably about 10 minutes to about 60 minutes, at temperature in a range of from about 20° C. to about 100° C., preferably about 25° C. to about 70° C. Such contacting times and temperatures are illustrative, and any other suitable time and temperature conditions may be employed that are efficacious to achieve the required removal selectivity.

After completion of a desired amount of selective etching of silicon-germanium, etching composition that remains on a surface of an etched microelectronic device can be removed from surface by any desired and useful method, such as by a rinse, wash, or other removal step, using water. For example, after etching, a microelectronic device substrate may be rinsed with a rinse solution of deionized water, followed by drying, e.g., spin-dry, $N_2$, vapor-dry etc.

The inventive etching compositions and methods can be particularly useful for selective etching of silicon-germanium, as a sacrificial layer, from a substrate that contains structures of silicon and germanium. In one example, the substrate contains multiple alternating layers of silicon and silicon-germanium. The inventive etching composition and methods can be useful to laterally etch the silicon-germanium material from between layers of silicon. The remaining structure includes silicon nanowires that can be useful for preparing a field-effect-transistor (FET) of a microelectronic device. The term "nanowire" is used herein in a manner that is consistent with the meaning that this term is given in the semiconductor and microelectronic device arts. Consistent therewith, a silicon nanowire can be a nano-scale structure made of silicon, e.g., monocrystalline silicon, which may be doped or undoped, and which may have dimensions that include a cross section (width) in a range from about 20 to 100 nanometers, e.g., 25 to 50 nanometers, and a longer dimension (e.g., length or height) that may be in a range from 100 to 400 nanometers, e.g., from 150 to 300 nanometers.

The inventive compositions and methods, in addition to being useful to prepare nanowires as described, that can be included for example in a field-effect transistor, will also be useful for preparing other structures, including three-dimensional silicon structures (e.g., on an insulator), silicon-on-nothing structures, and various other complex two-dimensional and three-dimensional silicon structures that will be useful as part of a microelectronic device, by use of the inventive etching compositions to selectively remove silicon-germanium, as a sacrificial material, from a substrate that contains silicon-germanium and silicon.

Example

Figure 1:
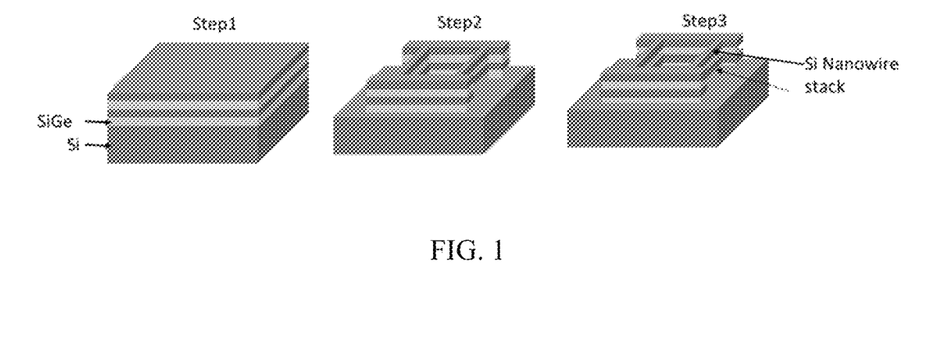
FIG. 1 shows steps of microelectronic fabrication, including a step of selective SiGe etching as described herein. This figure is not to scale and is schematic.

Selective removal of SiGe has been used to remove sacrificial material to generate advanced device structures such as silicon nanowires and silicon on nothing (SON). These devices are fabricated by epitaxial deposition of a layered structure followed by patterning and selective lateral etching to generate a 3 dimensional structure. This is shown schematically for a nanowire application in FIG. 1:

Step 1: An epitaxial stack of Si and SiGe is deposited.
Step 2: These are patterned with a standard lithographically generated mask and directional etch.
Step 3: An isotropic etch is used to laterally etch away the sacrificial SiGe material leaving behind a silicon nanowire.

One non-limiting example of a method for using an inventive composition and etching method of the present description is illustrated at Step 3 of FIG. 1, involving an etching step for removing sacrificial silicon-germanium from an epitaxial stack of Si and SiGe. An effective etch process to selectively remove the sacrificial SiGe can be one that is highly selective to SiGe removal relative to Si removal. It is desirable to use SiGe with low germanium content so that lattice mismatch and therefore dislocation density is minimized in the resultant Si nanowires. Reducing lattice mismatch by using sacrificial SiGe with a low germanium content results in a greater challenge in achieving a highly selective SiGe removal, because SiGe with low Ge content is becomes very similar chemically to pure silicon. It is also desirable to have etch rates that are not strongly dependent on crystal orientation.

Previously, for processing different microelectronic devices, selective etching of SiGe relative to Si (to prepare non-FET, non-nanowire structures) may have been performed using an isotropic dry etch using HCl, or by one of various potential wet etch approaches. One previously described method of selective etching involves a wet etch process that uses an etching composition of acetic acid/hydrogen peroxide/hydrofluoric acid/water mixtures (see Cams et al., "Chemical Etching of Si1-x Ge x in HF:H2O2:CH3COOH," Journal of the Electrochemical Society, vol. 142, no. 4, pp. 1260-1266, 1995). Various shortcomings of the described methods include that a significant reduction in SiGe:Si selectivity exists when operating at a low Ge content of the sacrificial SiGe material, and that long times are needed to achieve stable etch rates after $H_2O_2$ addition. Moreover, for a substrate that includes silicon oxide or silicon nitride that is or becomes is exposed during the selective SiGe etch step, low etch rates for these materials are desired. But a high HF concentration in formulations similar to those described by Cams et al. would be expected to make the described methods and compositions unsuitable for these applications.

Figure 2:
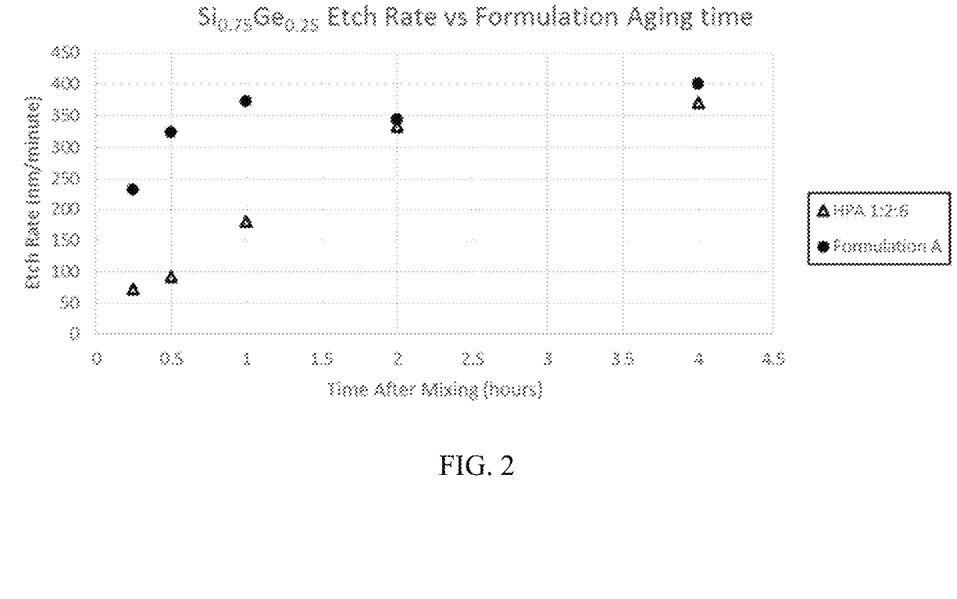
FIG. 2 shows example data of etch rate versus time after mixing of an etching composition.

FIG. 2 shows an etch rate of $Si_{0.75}Ge_{0.25}$ versus time after mixing, for an etching composition of HPA (1:2:6) (HF:H2O2:AA) and of an improved etching composition of the present disclosure. If we define a stable etch rate as changing less than 10% over the following 1 hour, the HPA formulation takes 2 hours to reach a stable etch rate, whereas a stable etch rate is achieved in 30 minutes for formulation A.

The formulations and performance summarize at Table 1 shows performance improvements of inventive etching compositions relative etching compositions that are made of hydrogen fluoride, hydrogen peroxide, acetic acid, and water only.

Etching Formulations and performance, with formulations shown weight percent of each ingredient.

(In parenthesis are reported parts by weight of each dissolved material in a composition. The balance is $H_2O$. In this table entries marked nm were not measured.)

TABLE 1

| Formulation | Ingredient concentrations in weight percent (Parts by weigh of each dissolved material) | | | | | |
|---|---|---|---|---|---|---|
| | HF (49%) | Lactic Acid (85%) | Formic Acid (85%) | Acetic Acid (99%) | Sulfonic Acid (80%) | $H_2O_2$ (30%) |
| Formulation A | 0.75 (0.368) | 8 (6.8) | 20 (17) | 20 (19.8) | 2 (1.6) | 49.25 (14.78) |
| Formulation B | 2 (0.97) | 0 | 20 (17) | 20 (19.8) | 2 (1.6) | 56 (16.8) |
| HPA 1:2:6 | 11 (5.39) | | | 67 (66.33) | | 22 (6.6) |

| Formulation | $Si_{0.75}Ge_{0.25}$: Si Selectivity | $Si_{0.75}Ge_{0.25}$: Etch rate (nm/min) | Si Etch rate (nm/min) | $SiO_2$ (thermal oxide) Etch rate (nm/min) | $SiN_x$ Etch rate (nm/min) | Time in Reach 90% SiGe Etch rate (mins) |
|---|---|---|---|---|---|---|
| Formulation A | 41 | 37 | 0.8 | 1.55 | 2.82 | 30 |
| Formulation B | 56 | 77 | 1.4 | 3.29 | nm | nm |
| HPA 1:2:6 | 23 | 37 | 1.7 | nm | nm | 120 |

What is claimed is:

1. An etching composition for selectively removing silicon-germanium from a surface of a microelectronic device relative to silicon, comprising:
   from 0.1 to 10 parts by weight hydrogen fluoride,
   from 5 to 50 parts by weight dissolved acetic acid,
   from 2 to 40 parts by weight dissolved formic acid,
   from 0.1 to 10 parts by weight dissolved sulfuric acid, and
   from 10 to 20 parts by weight dissolved lactic acid,
   per 100 parts by weight dissolved materials in the etching composition,
   in water.

2. The etching composition of claim 1, wherein the etching composition comprises from 10 to 70 weight percent water, based on total weight of the etching composition.

3. The etching composition of claim 1, wherein the etching composition comprises hydrogen peroxide from a separate hydrogen peroxide solution.

4. The etching composition of claim 1, wherein the etching composition further comprises
   from 10 to 35 parts by weight dissolved hydrogen peroxide.

5. An etching composition for selectively removing silicon-germanium from a surface of a microelectronic device relative to silicon, consisting essentially of:
   hydrogen fluoride,
   dissolved acetic acid,
   dissolved formic acid,
   dissolved sulfuric acid,
   from 10 to 20 parts by weight dissolved lactic acid, and
   optional hydrogen peroxide,
   in water.

* * * * *